US008821215B2

(12) United States Patent
Naguib Sant

(10) Patent No.: US 8,821,215 B2
(45) Date of Patent: Sep. 2, 2014

(54) POLYPYRROLIDONE POLISHING COMPOSITION AND METHOD

(75) Inventor: Nevin Naguib Sant, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 235 days.

(21) Appl. No.: 13/606,599

(22) Filed: Sep. 7, 2012

(65) Prior Publication Data

US 2014/0073226 A1    Mar. 13, 2014

(51) Int. Cl.
B24B 37/04 (2012.01)

(52) U.S. Cl.
USPC ............... 451/41; 451/59; 451/60; 451/446; 252/79.1; 216/88; 216/89; 106/3

(58) Field of Classification Search
CPC ...... B24B 37/042; B24B 37/30; B24B 37/04; B24B 37/26; B24B 37/24; H01L 21/3212; H01L 21/31053; C09G 1/02
USPC ................. 451/41, 57–59, 60, 446; 252/79.1; 216/88, 89; 106/3, 491, 450, 499
See application file for complete search history.

(56) References Cited

U.S. PATENT DOCUMENTS

| | | | |
|---|---|---|---|
| 2,739,922 A * | 3/1956 | Shelanski ..................... 524/548 |
| 4,231,749 A * | 11/1980 | Balland .............................. 8/584 |
| 4,606,912 A * | 8/1986 | Rudy et al. ...................... 424/52 |
| 4,610,873 A * | 9/1986 | Rudy et al. ...................... 424/52 |
| 5,196,353 A | 3/1993 | Sandhu et al. |
| 5,230,833 A | 7/1993 | Romberger et al. |
| 5,352,277 A | 10/1994 | Sasaki |
| 5,433,651 A | 7/1995 | Lustig et al. |
| 5,609,511 A | 3/1997 | Moriyama et al. |
| 5,643,046 A | 7/1997 | Katakabe et al. |
| 5,658,183 A | 8/1997 | Sandhu et al. |
| 5,730,642 A | 3/1998 | Sandhu et al. |
| 5,838,447 A | 11/1998 | Hiyama et al. |
| 5,868,604 A * | 2/1999 | Atsugi et al. ..................... 451/36 |
| 5,872,633 A | 2/1999 | Holzapfel et al. |
| 5,893,796 A | 4/1999 | Birang et al. |
| 5,949,927 A | 9/1999 | Tang |
| 5,964,643 A | 10/1999 | Birang et al. |
| 6,132,637 A * | 10/2000 | Hosali et al. .................. 252/79.1 |
| 6,146,244 A * | 11/2000 | Atsugi et al. ..................... 451/36 |
| 6,218,305 B1 * | 4/2001 | Hosali et al. ................... 438/691 |
| 7,232,529 B1 | 6/2007 | Uchida et al. |
| 8,357,311 B2 * | 1/2013 | Shirota et al. ................. 252/79.1 |
| 2004/0148867 A1 * | 8/2004 | Matsumi .......................... 51/298 |
| 2006/0228999 A1 * | 10/2006 | Ferranti ........................... 451/41 |
| 2007/0049180 A1 | 3/2007 | Shida et al. |
| 2007/0190906 A1 | 8/2007 | Uchida et al. |
| 2007/0190910 A1 * | 8/2007 | Ferranti ........................... 451/41 |
| 2009/0298394 A1 | 12/2009 | Katoh et al. |
| 2010/0003821 A1 | 1/2010 | Morinaga et al. |
| 2010/0087065 A1 | 4/2010 | Boggs et al. |
| 2010/0330884 A1 * | 12/2010 | Liu .................................. 451/42 |
| 2011/0062115 A1 * | 3/2011 | Reiss et al. ...................... 216/88 |
| 2011/0136344 A1 * | 6/2011 | Reiss et al. .................... 438/693 |
| 2012/0034851 A1 * | 2/2012 | Song ............................... 451/59 |
| 2012/0190199 A1 * | 7/2012 | Reiss et al. .................... 438/692 |

OTHER PUBLICATIONS

Belyakova et al., "Study of interaction of poly(1-vinyl-2-pyrrolidone) with a surface of highly dispersed amorphous silica," *Journal of Colloid and Interface Science*, 264: 2-6 (2003).
Bershtein et al., "Well-defined silica core-poly(vinyl pyrrolidone) shell nanoparticles: Interactions and multi-modal glass transition dynamics at interfaces," *Polymer*, 50: 860-871 (2009).
Fadnavis et al., "Surfactant-Polymer Interactions and Their Effects on the Micellar Inhibition of the Neutral Hydrolysis of 1-Benzoyl-1,2,4-triazole," *J. Am. Chem. Soc.*, 106: 2636-2640 (1984).
Kim et al., "Silicon Wafer Technique for Infrared Spectra of Silica and Solid Samples (I)," *Korean J. of Chem. Eng.*, 3(1): 45-51 (1986).
Mishra et al., "Surface enhanced optical absorption and photoluminescence in nonbonding electrons in small poly(vinylpyrrolidone) molecules," *The Journal of Chemical Physics*, 126: 084902-1-084902-6 (2007).
Zhou et al., "Ru nanoparticles stabilized by poly(N-vinyl-2-pyrrolidone) grafted onto silica: Very active and stable catalysts for hydrogenation of aromatics," Journal of Molecular Catalysis A: Chemical, 306: 143-148 (2009).

* cited by examiner

*Primary Examiner* — George Nguyen
(74) *Attorney, Agent, or Firm* — Thomas E Omholt; Alisha K. Bull; Steven D Weseman

(57) ABSTRACT

The invention provides a polishing composition containing a pyrrolidone polymer, an aminophosphonic acid, a tetraalkylammonium salt, and water, wherein the composition has a pH of about 7 to about 11.7. The invention further provides a method of using such a polishing composition to polish a substrate, especially a substrate containing silicon.

16 Claims, No Drawings

POLYPYRROLIDONE POLISHING COMPOSITION AND METHOD

BACKGROUND OF THE INVENTION

Methods for polishing wafers used in electrical integrated circuits typically include a two step process of first, a primary polishing step, and second, a final polishing step. The primary polishing is a polishing process to remove surface defects as a result of, for example, deposition of metal onto the surface of a silicon substrate. The primary polishing process typically involves the use of a polishing composition in a chemical-mechanical polishing (CMP) process in which the polishing composition oxidizes a film surface of the substrate or wafer and removes the resultant oxide layer with the aid of solid abrasive grains.

However, the use of abrasives and/or oxidizing agents in the primary polishing solution is associated with various disadvantages such as creating scratches on the surface of the substrate, abrasives remaining attached to the substrate surface after polishing, and over polishing of the substrate. Typically, wafers have surface defects of approximately 10 to 50 µm after primary polishing, which are too great for satisfactory performance. Therefore, a second, final polishing is required.

The final polishing finishes a surface of a substrate by reducing surface roughness. However, the final polishing process typically uses a different polishing composition than that for the primary polishing process. Further, the final polishing composition typically does not result in high removal rates of materials on the substrate because the final polishing composition typically is more gentle than the primary polishing composition. As a result, the final polishing composition typically requires a longer polishing time and longer rinse time.

There exists a need for a polishing composition that results in low surface defects of the substrate undergoing polishing and achieves high removal rates.

BRIEF SUMMARY OF THE INVENTION

The invention provides a polishing composition comprising (a) 0.01 wt. % to 0.1 wt. % of a pyrrolidone polymer, (b) 0.05 wt. % to 2 wt. % of an aminophosphonic acid, (c) 0.01 wt. % to 5 wt. % of a tetraalkylammonium salt, and (d) water, wherein the composition has a pH of about 7 to about 11.7.

The invention provides a polishing composition consisting essentially of (a) 0.01 wt. % to 0.1 wt. % of a pyrrolidone polymer, (b) 0.05 wt. % to 2 wt. % of an aminophosphonic acid, (c) 0.01 wt. % to 5 wt. % of a tetraalkylammonium salt, (d) optionally, 0.05 wt. % to 2 wt. % of a rate accelerator, (e) optionally, a pH adjustor, (f) optionally, a bicarbonate salt, and (g) water, wherein the composition has a pH of about 7 to about 11.7.

The invention provides a method of polishing a substrate, the method comprising (i) contacting a substrate with a polishing pad and a polishing composition of the present invention, (ii) moving the polishing pad relative to the substrate with the polishing composition therebetween, and (iii) abrading at least a portion of the substrate to polish the substrate.

DETAILED DESCRIPTION OF THE INVENTION

The invention provides a polishing composition comprising, consisting essentially of, or consisting of (a) 0.01 wt. % to 0.1 wt. % of a pyrrolidone polymer, (b) 0.05 wt. % to 2 wt. % of an aminophosphonic acid, (c) 0.01 wt. % to about 5 wt % of a tetraalkylammonium salt, and (d) water, wherein the composition has a pH of about 7 to about 11.7.

The polishing composition of the invention comprises a pyrrolidone polymer, i.e., any polymer comprising a pyrrolidone monomer. The pyrrolidone monomer can be any suitable pyrrolidone monomer or combination of pyrrolidone monomers. Particularly useful pyrrolidone polymers are polyvinylpyrrolidone and poly(1-vinylpyrrolidone-co-2-dimethylamino-ethyl methacrylate). The weight average molecular weight of the pyrrolidone polymer is 1,000 or more, 10,000 or more, 50,000 or more, 100,000 or more, 500,000 or more, or 1,000,000 or more. Alternatively, or in addition, the weight average molecular weight of the pyrrolidone polymer is 5,000,000 or less, 3,000,000 or less, or 2,000,000 or less. Thus, the weight average molecular weight of the pyrrolidone polymer can be bound by any two of the above endpoints. For example, the pyrrolidone polymer can have a weight average molecular weight of 1,000-5,000,000, 50,000-5,000,000, 500,000-3,000,000, or 1,000,000-2,000,000.

The polishing composition can comprise any suitable amount of the pyrrolidone polymer. The polishing composition can contain 0.001 wt. % or more, 0.005 wt. % or more, or 0.01 wt. % or more of the pyrrolidone polymer. Alternatively, or in addition, the polishing composition can contain 5 wt. % or less, 1 wt. % or less, 0.5 wt. % or less, or 0.1 wt. % or less of the pyrrolidone polymer. Thus, the polishing composition can comprise an amount of pyrrolidone polymer in an amount bounded by any two of the above endpoints. For example, the pyrrolidone polymer can be present in the polishing composition in an amount of 0.001-5 wt. %, 0.005-1 wt. %, or 0.01-0.1 wt. %.

The polishing composition of the invention comprises an aminophosphonic acid. The aminophosphonic acid can be any suitable aminophosphonic acid or combination of aminophosphonic acids. Preferably, the aminophosphonic acid is selected from the group consisting of ethylenediaminetetra(methylene phosphonic acid), amino tri(methylene phosphonic acid), diethylenetriaminepenta(methylene phosphonic acid), salts thereof, and combinations thereof. More preferably, the aminophosphonic acid is amino tri(methylene phosphonic acid).

The polishing composition can contain any suitable amount of aminophosphonic acid. The polishing composition can contain 0.001 wt. % or more, 0.05 wt. % or more, 0.1 wt. % or more, 0.2 wt. % or more, or 0.5 wt. % or more of the aminophosphonic acid. Alternatively, or in addition, the polishing composition can contain 2 wt. % or less, 1.5 wt. % or less, 1 wt. % or less, or 3 wt. % or less of the aminophosphonic acid. Thus, the polishing composition can comprise the aminophosphonic acid in an amount bounded by any two of the above endpoints recited for the aminophosphonic acid. For example, the aminophosphonic acid can be present in the polishing composition in an amount of 0.2-3 wt. %, 0.5-1 wt. %, or 0.1-1.5 wt. %.

The polishing composition comprises a tetraalkylammonium salt. The tetraalkylammonium salt can be any suitable tetraalkylammonium salt or combination of tetraalkylammonium salts. The tetraalkylammonium salt preferably comprises a cation selected from the group consisting of tetramethylammonium, tetraethylammonium, tetrapropylammonium, and tetrabutylammonium. The tetraalkylammonium salt can have any suitable cation including but not limited to hydroxide, chloride, bromide, sulfate, or hydrogensulfate. The tetraalkylammonium salt can be a tetraalkylammonium hydroxide (e.g., tetramethylammonium hydroxide).

The polishing composition can comprise any suitable amount of the tetraalkylammonium salt. The polishing composition can contain 0.01 wt. % or more, 0.1 wt. % or more, 0.2 wt. % or more, or 0.5 wt. % or more of the tetraalkylammonium salt. Alternatively, or in addition, the polishing composition can contain about 5 wt. % or less, 4 wt. % or less, 3 wt. % or less, or 2 wt. % or less of the tetraalkylammonium salt. Thus, the polishing composition can comprise the tetraalkylammonium salt in an amount bounded by any two of the above endpoints recited for the tetralkylammonium salt. For example, the tetraalkylammonium salt can be present in the polishing composition in an amount of 0.2-3 wt. %, 0.5-2 wt. %, or 0.1-5 wt. %.

The polishing composition of the invention can further comprise a rate accelerator. The rate accelerator can be any suitable rate accelerator or combination of rate accelerators. For example, the rate accelerator can be a hydroxamic acid (e.g., acetohydroxamic acid) or a suitable nitrogen-containing heterocyclic compound.

The term nitrogen-containing heterocyclic compound as used herein refers to a 5-, 6-, or 7-membered ring compound having one or more nitrogen atoms contained as part of the ring system. The nitrogen-containing heterocyclic compound can be a triazole. The nitrogen-containing heterocyclic compound can be an aminotriazole. Non-limiting examples of suitable aminotriazoles include 3-amino-1,2,4-triazole, 3-amino-1,2,4-triazole-5-carboxylic acid, 3-amino-5-mercapto-1,2,4-triazole, and 4-amino-5-hydrazino-1,2,4-triazole-3-thiol. The nitrogen-containing heterocyclic compound can be a thiazole. Non-limiting examples of suitable thiazoles include 2-amino-5-methylthiazole and 2-amino-4-thoazoleacetic acid. The nitrogen-containing heterocyclic compound can be a heterocyclic N-oxide. Non-limiting examples of suitable heterocyclic N-oxides include 2-hydroxypyridine-N-oxide, 4-methylmorpholine-N-oxide, and picolinic acid N-oxide.

The polishing composition can comprise any suitable amount of the rate accelerator. The polishing composition can contain 0.02 wt. % or more, 0.05 wt. % or more, about 0.1 wt. % or more, or 0.3 wt. % or more of the rate accelerator. Alternatively, or in addition, the polishing composition can contain about 5 wt. % or less, 4 wt. % or less, 3 wt. % or less, 2 wt. % or less, or 1 wt. % or less of the rate accelerator. Thus, the polishing composition can comprise an amount of rate accelerator in an amount bounded by any two of the above endpoints. For example, the rate accelerator can be present in the polishing composition in an amount of 0.02-5 wt. %, 0.05-3 wt. %, or 0.1-2 wt. %.

The polishing composition can further comprise one or more bicarbonate salts. The bicarbonate salt can be any suitable bicarbonate salt and can be, for example, potassium bicarbonate, sodium bicarbonate, ammonium bicarbonate, or combinations thereof.

The polishing composition can contain any suitable amount of the bicarbonate salt. The polishing composition can contain 0.05 wt. % or more, 0.1 wt. % or more, 0.5 wt. % or more, or 1 wt. % or more of the bicarbonate salt. Alternatively, or in addition, the polishing composition can contain 5 wt. % or less, 4 wt. % or less, 3 wt. % or less, or 2 wt. % or less of the bicarbonate salt. Thus, the polishing composition can comprise the bicarbonate salt in an amount bounded by any two of the above endpoints recited for the bicarbonate salt. For example, the bicarbonate salt can be present in the polishing composition in an amount of 0.05-3 wt. %, 0.1-4 wt. %, or 0.1-2 wt. %.

The polishing composition can comprise an oxidizing agent. The oxidizing agent is a substance that oxidizes a metal and/or silicon dioxide-based layer of a substrate. The oxidizing agent can be any suitable oxidizing agent or combination of oxidizing agents. Preferably, the oxidizing agent is at least one of potassium hydroxide, hydrogen peroxide, ammonium persulfate, hydroxylamine, and ammonia iodate.

The polishing composition can contain any suitable amount of oxidizing agent. The polishing composition can contain 0.05 wt. % or more, 0.1 wt. % or more, or 0.25 wt. % or more of oxidizing agent. Alternatively, or in addition, the polishing composition can contain 2 wt. % or less, 1.5 wt. % or less, 1 wt. % or less, 0.8 wt % or less, or 0.6 wt. % or less of oxidizing agent. Thus, the polishing composition can comprise the oxidizing agent in an amount bounded by any two of the above endpoints recited for the oxidizing agent. For example, the oxidizing agent can be present in the polishing composition in an amount of 0.05-2 wt. %, 0.1-1.5 wt. %, or 0.25-1 wt. %.

Alternatively, the polishing composition can exclude an oxidizing agent; i.e., the invention provides a polishing composition that does not contain any oxidizing agent.

The polishing composition may comprise an abrasive. The abrasive can be any suitable abrasive or combination of abrasives, including, without limitation, metallic and solid elemental particles, polymer particles, oxides, fluorides, carbonates, borides, nitrides and hydroxides of aluminum, silica, zirconium, titanium, and mixtures thereof.

The abrasive can comprise silica particles. The silica can be any suitable form of silica such as wet-process type silica, fumed silica, or combinations thereof. For example, the silica can comprise wet-process type silica particles (e.g., condensation-polymerized or precipitated silica particles). Condensation-polymerized silica particles typically are prepared by condensing $Si(OH)_4$ to form colloidal particles, where colloidal particles are defined as having an average particle size between about 1 nm and about 1000 nm. Such abrasive particles can be prepared in accordance with U.S. Pat. No. 5,230,833 or can be obtained as any of various commercially available products, such as the Akzo-Nobel Bindzil 50/80 product, the Nalco DVSTS006 product, and the Fuso PL-2 product, as well as other similar products available from DuPont, Bayer. Applied Research, Nissan Chemical, and Clariant.

The silica can have any suitable average particle size (i.e., average particle diameter). The silica can have an average particle size of 4 nm or more, 10 nm or more, 15 nm or more, 20 nm or more, or 25 nm or more. Alternatively, or in addition, the silica can have an average particle size of 180 nm or less, 160 nm or less, 120 nm or less, 110 nm or less, 100 nm or less, 90) nm or less, 80 nm or less, 70 nm or less, 60 nm or less, 50 nm or less, or 40 nm or less. Thus, the silica can have an average particle size bounded by any two of the above endpoints. For example, the silica can have an average particle size of 10-1001 nm, 20-160 nm, 20-80 nm, 20-60 nm, or 20-40 nm. For a non-spherical particle, the size of the particle is the diameter of the smallest sphere that encompasses the particle.

The abrasive particles preferably are colloidally stable. The term colloid refers to the suspension of abrasive particles in the liquid carrier. Colloidal stability refers to the maintenance of that suspension through time. In the context of this invention, an abrasive is considered colloidally stable if, when the abrasive is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., {[B]−[T]}/[C]≤0.5). More preferably, the value of [B]−[T]/[C] is less than or equal to 0.3, and most preferably is less than or equal to 0.1.

The polishing composition can contain any suitable amount of abrasive. The polishing composition can contain 0.5 wt. % or more, 1 wt. % or more, 2 wt. % or more, or 5 wt. % or more of abrasive. Alternatively, or in addition, the polishing composition can contain 20 wt. % or less, 15 wt. % or less, 10 wt. % or less, 8 wt. % or less, or 6 wt. % or less of abrasive. Thus, the polishing composition can comprise abrasive in an amount bounded by any two of the above endpoints recited for the abrasive. For example, the polishing composition can comprise 0.5-6 wt. %, 1-20 wt. %, 2-10 wt. %, or 5-20 wt. % of abrasive.

Alternatively, the polishing composition can exclude an abrasive, i.e., the invention provides a polishing composition that does not contain any abrasive.

The polishing composition comprises water. The water is used to facilitate the application of the polishing composition on the substrate to be polished. Preferably, the water is deionized water. All of the amounts of the components (wt. %'s) recited herein are based on the total amount of the polishing composition, i.e., the water and all other components of the polishing composition unless otherwise indicated.

The polishing composition can comprise one or more other additives. Such additives include a dispersing agent. The dispersing agent can be any suitable dispersing agent or combination of dispersing agents, such as, for example, homopolymers or random, block, or gradient acrylate copolymers comprising one or more acrylic monomers (e.g., polyacrylates, polymethacrylates, vinyl acrylates and styrene acrylates), combinations thereof, and salts thereof. Other suitable additives include biocides. The biocide can be any suitable biocide or combination of biocides, for example, an isothiazolinone biocide.

The polishing composition of the invention can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., pyrrolidine polymer, rate accelerator, tetraalkylammonium salt, etc.) as well as any combination of ingredients.

The polishing composition has a pH of about 11.7 or less (e.g., about 10 or less). Preferably, the polishing composition has a pH of about 7 or more (e.g., about 8 or more). Even more preferably, the polishing composition has a pH of about 7 to about 11.7 (e.g., about 8 to about 10).

The polishing composition can comprise a pH adjustor, a pH buffering agent, or combination thereof. The pH adjustor can be any suitable pH-adjusting compound or combination of pH-adjusting compounds. For example, the pH adjustor can be any suitable acid or base strong enough to produce the desired final pH. Examples of suitable acids include nitric acid, acetic acid, phosphoric acid, and the like. Examples of suitable bases include potassium hydroxide, ammonium hydroxide, and tetraalkylammonium hydroxide. The pH buffering agent can be any suitable pH buffering agent or combination of pH buffering agents, for example, phosphates, acetates, borates, ammonium salts, and the like. Many such pH buffering systems are well known in the art. Examples of suitable pH buffering agents are bicarbonate-carbonate buffer systems, aminoalkylsulfonic acids, and the like. The polishing composition can comprise any suitable amount of a pH adjustor and/or a pH buffering agent, desirably an amount that achieves and/or maintains the pH of the polishing composition within a suitable range.

The polishing composition also can be provided as a concentrate which is intended to be diluted with an appropriate amount of water prior to use. In such an embodiment, the polishing composition concentrate can comprise, for example, a pyrrolidone polymer, rate accelerator, aminophosphonic acid, tetraalkylammonium salt, and water in amounts such that, upon dilution of the concentrate with an appropriate amount of water and possibly oxidizing agent, each component of the polishing composition will be present in the polishing composition in an amount within the appropriate range recited above for each component. Furthermore, as will be understood by those of ordinary skill in the art, the concentrate can contain an appropriate fraction of the water present in the final polishing composition in order to ensure that the one or more of the other components are at least partially or fully dissolved in the concentrate.

The polishing composition can be supplied as a one-package system comprising a pyrrolidone polymer, rate accelerator, aminophosphonic acid, and tetraalkylammonium salt in an aqueous medium. Alternatively, for a polishing composition comprising an oxidizing agent, the pyrrolidone polymer, rate accelerator, aminophosphonic acid, and tetraalkylammonium salt may be supplied in a first container, and the oxidizing agent can be supplied in a second container by itself or as a solution in water. For example, potassium hydroxide is desirably supplied separately from the other components of the polishing composition and is combined, e.g., by the end-user, with the other components of the polishing composition shortly before use (e.g., 1 week or less prior to use, 1 day prior to use, 1 hour prior to use, 10 minutes prior to use, or 1 minute prior to use) or directly at the point-of-use. Other two-container or three or more container systems are within the knowledge of one of ordinary skill in the art.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). If the polishing composition is to be produced using point-of-use mixing, the components of the polishing composition are separately stored in two or more storage devices, as appropriate. By the term "flow line" is meant a path of flow from an individual storage container to the point-of-use of the component stored therein. The one or more flow lines can each lead directly to the point-of-use, or, in the situation that more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if they are combined about 5 minutes or less prior to being added in mixed form to the point of use, e.g., onto a polishing pad or platen used in the polishing of a substrate, for example, about 4 minutes or less, about 3 minutes or less, about 2 minutes or less, about 1 minute or less, about 45 seconds or less, about 30 seconds or less, about 10 seconds or less, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The invention provides a method of polishing a substrate. The method comprises (i) contacting a substrate with a polishing pad and a polishing composition of the present invention, (ii) moving the polishing pad relative to the substrate with the polishing composition therebetween, and (iii) abrading at least a portion of the substrate to polish the substrate.

Although the polishing composition of the invention can be used to polish any substrate, the polishing composition is particularly useful in the polishing of a substrate comprising silicon, for example, silicon wafers used in the electronic industry. The wafers of the semiconductor industry typically comprise or consist of, for example, a metal, metal oxide, metal nitride, metal composite, metal alloy, a low dielectric material, or combinations thereof. The inventive polishing composition and method of use thereof is suitable for the pre-polishing or the final polishing of the silicon wafers as produced from silicon single crystals by diamond sawing and rough grinding, as well as for edge polishing of silicon wafers and for use in the reclamation of silicon wafers by polishing.

The polishing composition and method of the invention are particularly suited for polishing silicon wafers comprising a silicon dioxide-based dielectric layer, which can be derived from any suitable precursor. Preferably, the silicon dioxide-based dielectric layer is derived from silane precursors, more preferably from oxidized silane precursors, such as tetraethylorthosilicate (TEOS). The silicon dioxide-based dielectric layer can include but is not limited to borophosphosilicate glass (BPSG), PETEOS, thermal oxide, undoped silicate glass, and HDP oxide.

The polishing composition and methods of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate. In particular, in the course of polishing a substrate, material on the surface of the substrate, e.g., one or more of the aforementioned materials, is abraded, i.e., removed from the surface of the substrate, so as to polish the substrate and provide a smoother, more planar substrate surface.

A substrate can be polished with the polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical polishing pads include, but are not limited to, SURFIN™ 000, SURFIN™ SSW1, SPM3100 (commercially available from Eminess Technologies), POLITEX™, and Fujibo POLYPAS™ 27 polishing pads. A particularly preferred polishing pad is the EPIC™ D100 polishing pad commercially available from Cabot Microelectronics.

Desirably, the chemical-mechanical polishing apparatus further comprises an in situ polishing endpoint detection system. Techniques for inspecting and monitoring the polishing process by analyzing light or other radiation reflected from a surface of the substrate being polished are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a substrate being polished enables the determination of the polishing end-point, i.e., the determination of when to terminate the polishing process with respect to a particular substrate.

Advantageously, the polishing composition and method of the invention provide improved removal rates (i.e., abrasion of materials from the surface of substrates) when used to polish certain substrates, especially silicon wafers. In addition, the inventive polishing composition and method provide improved surface roughness (i.e., a more smooth or planar substrate surface) when used to polish certain substrates, especially silicon wafers.

EXAMPLES

The polyvinyl pyrrolidone used in the examples is PVPK90, available from BASF, which has a molecular weight of 1,200-2,000 kD as determined by gas phase chromatography. The aminotri(methylene) phosphonic acid (ATMP) used was Dequest 2000EG available from Dequest. The polishing was performed using a Suba 500 polishing pad on a substrate comprising a silicon surface. The surface roughness of the substrate was determined by power spectral density (PSD).

Example 1

Polishing compositions 1A, 1B, and 1C were prepared with polyvinyl pyrrolidone (PVP), aminotri(methylene) phosphonic acid (ATMP), tetramethyl ammonium hydroxide (TMAH), potassium hydroxide (KOH), 1,2,4-triazole, lactic acid, potassium carbonate ($K_2CO_3$), and condensation-polymerized silica having an average particle size of 55 nm in the amounts indicated in Table 1 with the remainder water, with a pH of about 10.5-11. Polishing compositions 1A and 1B were prepared in accordance with the invention, whereas polishing composition 1C lacked a pyrrolidone polymer and, therefore, was not an inventive polishing composition but rather a comparative polishing composition. These polishing compositions then were used to polish a silicon substrate under similar polishing conditions. The removal rate (RR) and surface roughness as indicated by power spectral density (PSD) for each polishing composition were determined and are set forth in Table 1.

TABLE 1

| Composition | 1A | 1B | 1C |
| --- | --- | --- | --- |
| PVP (wt. %) | 0.04 | 0.04 | 0 |
| ATMP (wt. %) | 0.39 | 0.39 | 0.30 |
| TMAH (wt. %) | 2.63 | 2.63 | 2.00 |
| KOH (wt. %) | 0.79 | 0.79 | 0.60 |
| 1,2,4-triazole (wt. %) | 0.44 | 0.44 | 0 |
| Lactic Acid (wt. %) | 0 | 0 | 0.33 |
| $K_2CO_3$ (wt. %) | 1.31 | 1.31 | 1.00 |
| Colloidal Silica (wt. %) | 13.125 | 0 | 10.0 |
| Removal Rate (Å/min) | 5500 | 4300 | 4600 |
| PSD (nm) | 1.4 | 1.5 | 1.7 |

As is apparent from the data set forth in Table 1, polishing composition 1A exhibited more than a 15% higher removal rate as compared to polishing composition 1C, which did not contain PVP. Polishing composition 1A also reduced the surface roughness of the substrate by 17% as compared to polishing composition 1C. Polishing composition 1B, which did not contain any abrasive, exhibited a removal rate only about 6% lower as compared to polishing composition 1C, which contained 10 wt % abrasive, and yet reduced the surface roughness by nearly 12% as compared to polishing composition 1C.

Example 2

Polishing compositions 2A-2F were prepared with 0.39 wt. % aminotri(methylene)phosphonic acid (ATMP), 2.63 wt. % tetramethyl ammonium hydroxide (TMAH), 0.79 wt. % KOH, 1.31 wt. % $K_2CO_3$, and 13.125 wt. % condensation-polymerized silica having an average particle size of 55 nm. Polishing compositions 2A-2F further comprised 0.04 wt. % of either polyvinyl pyrrolidone (PVP) or poly(1-vinylpyrrolidone-co-2-dimethylamino-ethyl methacrylate) (PVP-2), and 0.44 wt. % of either 1,2,4-triazole, hydroxylamine, acetohydroxamic acid, trans-1,2-cyclohexanediol, or 2-amino-4-thiazole acetic acid as indicated in Table 2, with the remainder water, with a pH of about 10.5-11. Polishing compositions 2A-2F were prepared in accordance with the invention. Polishing composition 2G lacked a pyrrolidone polymer and a rate accelerator and, therefore, was not an inventive polishing composition but rather a comparative polishing composition. These polishing compositions then were used to polish a silicon substrate under similar polishing conditions. The removal rate (RR) for each polishing composition was determined and is set forth in Table 2.

TABLE 2

| Composition | Pyrrolidone Polymer | Rate Accelerator | Removal Rate (Å/min) |
| --- | --- | --- | --- |
| 2A | PVP | — | 5200 |
| 2B | PVP | hydroxylamine | 5400 |
| 2C | PVP | acetohydroxamic acid | 5900 |
| 2D | PVP-2 | 1,2,4-triazole | 5900 |
| 2E | PVP | trans-1,2-cyclohexanediol | 5200 |
| 2F | PVP | 2-amino-4-thiazole acetic acid | 4400 |
| 2G | — | — | 3200 |

As apparent from the data set forth in Table 2, the type of pyrrolidone polymer and rate accelerator affects the removal rate. The highest removal rates were achieved in polishing compositions 2C (PVP in combination with acetohydroxamic acid as the rate accelerator) and 2D (PVP-2 in combination with 1,2,4-triazole as the rate accelerator).

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A polishing composition comprising:
   (a) 0.01 wt. % to 0.1 wt. % of a pyrrolidone polymer;
   (b) 0.05 wt. % to 2 wt. % of an aminophosphonic acid;
   (c) 0.01 wt. % to 5 wt. % of a tetraalkylammonium salt; and
   (d) water,
   wherein the composition has a pH of about 7 to about 11.7.

2. The polishing composition of claim 1 further comprising 0.05 wt. % to 2 wt. % of a rate accelerator.

3. The polishing composition of claim 1 further comprising 0.01 wt % to 40 wt % of a silica particle.

4. The polishing composition of claim 1, wherein the composition does not contain an abrasive.

5. The polishing composition of claim 1, wherein the composition does not contain an oxidizer of silicon.

6. A polishing composition consisting essentially of:
   (a) 0.01 wt. % to 0.1 wt. % of a pyrrolidone polymer;
   (b) 0.05 wt. % to 2 wt. % of an aminophosphonic acid;
   (c) 0.01 wt. % to 5 wt. % of a tetraalkylammonium salt;
   (d) optionally, 0.05 wt. % to 2 wt. % of a rate accelerator;
   (e) optionally, a pH adjustor;
   (f) optionally, a bicarbonate salt; and
   (g) water,
   wherein the composition has a pH of about 7 to about 11.7.

7. The polishing composition of claim 6, wherein the rate accelerator comprises a hydroxamic acid.

8. The polishing composition of claim 7, wherein the rate accelerator comprises an acetohydroxamic acid.

9. The polishing composition of claim 6, wherein the rate accelerator comprises a nitrogen containing heterocyclic compound.

10. The polishing composition of claim 9, wherein the nitrogen containing heterocyclic compound comprises a triazole.

11. The polishing composition of claim 6, wherein the pyrrolidone polymer comprises polyvinylpyrrolidone.

12. The polishing composition of claim 6, wherein the pyrrolidone polymer comprises poly(1-vinylpyrrolidone-co-2-dimethylamino-ethyl methacrylate).

13. The polishing composition of claim 6, wherein the aminophosphonic acid comprises aminotrimethylene phosphonic acid.

14. The polishing composition of claim 6, wherein the tetraalkylammonium salt comprises tetramethyl ammonium hydroxide.

15. A method of polishing a substrate, which method comprises:
   (i) contacting a substrate with a polishing pad and the polishing composition of claim 6;
   (ii) moving the polishing pad relative to the substrate with the polishing composition therebetween; and
   (iii) abrading at least a portion of the substrate to polish the substrate.

16. The method of claim 15, wherein the substrate is a silicon wafer.

* * * * *